(12) United States Patent
Ju

(10) Patent No.: US 7,204,700 B2
(45) Date of Patent: Apr. 17, 2007

(54) ELECTRICAL CONNECTOR

(76) Inventor: Ted Ju, No. 15, Wu Shiun St., An-Lo Dist., Keelung City (TW)

(*) Notice: Subject to any disclaimer, the term of this patent is extended or adjusted under 35 U.S.C. 154(b) by 0 days.

(21) Appl. No.: 11/228,279

(22) Filed: Sep. 19, 2005

(65) Prior Publication Data

US 2006/0116015 A1    Jun. 1, 2006

(30) Foreign Application Priority Data

Nov. 27, 2004    (CN) .................. 2004 2 0102016

(51) Int. Cl.
*H05K 1/00*    (2006.01)
(52) U.S. Cl. .................. 439/71; 439/73; 439/526; 439/910
(58) Field of Classification Search ............. 439/910, 439/71, 73, 331, 525, 526
See application file for complete search history.

(56) References Cited

U.S. PATENT DOCUMENTS

| | | | | |
|---|---|---|---|---|
| 5,669,783 A | * | 9/1997 | Inoue et al. | 439/331 |
| 6,287,137 B1 | * | 9/2001 | Noda et al. | 439/342 |
| 6,325,655 B1 | * | 12/2001 | Noda et al. | 439/342 |
| 6,832,919 B2 | * | 12/2004 | Ma et al. | 439/73 |

* cited by examiner

*Primary Examiner*—Gary F. Paumen
(74) *Attorney, Agent, or Firm*—Rosenberg, Klein & Lee

(57) ABSTRACT

The electrical connector includes a connector body and an accessing device. The connector body includes an insulation body that receives a plurality of pins and has a multilateral through hole in the middle. The PCB has a positioning frame line that corresponds to the through hole. The accessing device has one or a plurality of holes near the middle of the accessing device and the one or the plurality of holes cover at least one part of the positioning frame's two sides that are not located opposite. The precision of the positioning is enhanced substantially and the welding effect is ensured between the electrical connector and the PCB.

4 Claims, 5 Drawing Sheets

ELECTRICAL CONNECTOR

BACKGROUND OF THE INVENTION

1. Field of the Invention

The present invention relates to an electrical connector. In particular, an electrical connector has an accessing device.

2. Description of the Related Art

Vacuum sucking apparatuses are extensively applied in the electronic industry. They are used for transmitting electronic components, such as electrical connectors, to a default location on a printing circuit broad (PCB). As such, the electronic components are automatically installed. The sucking mouth of a vacuum sucking apparatus sucks the electrical connector securely via air pressure. Next, the vacuum sucking apparatus automatically moves the electronic components to their exact location on the PCB.

FIG. 1 shows an electrical connector of the prior art. The electrical connector includes a connector body and an accessing device. The connector body includes an upper metal shell 1 and a lower metal shell 2 that are connected to each other, a pole 3 that is used for buckling the upper metal shell 1 and the lower metal shell 2, and an insulation body 4 that is received in the lower metal shell 2. The insulation body 4 receives a plurality of pins (not shown in the figure) and has a square through hole 40 in the middle. The accessing device 5 includes a board body 50 and a holding pin 51 that is downwardly extended from a lower surface of the board body 50. The holding pin 51 is used for fixing the accessing device 5 on the upper metal shell 1.

Before the electrical connector is assembled to the PCB 6, the electrical connector is buckled and fixed. During the assembly, a vacuum sucking apparatus sucks the electrical connector and moves the electrical connector to a default location on the PCB. The positioning between the electrical connector and the PCB is implemented via the following method. The PCB has an outer positioning frame line and an inner position frame line that correspond to the outer fringe and the square through hole of the electrical connector. When the electrical connector is located, the positioning between the electrical connector and the PCB is checked to see whether the outer fringe of the electrical connector aligns to the outer positioning frame line or not. However, because the electrical connector of the prior art is not close to the PCB, it is very difficult to position precisely. If the connector is positioned poorly, the welding between the electrical connector and the PCB is bad. Therefore, the electrical connector cannot perform well.

SUMMARY OF THE INVENTION

One particular aspect of the present invention is to provide an electrical connector. The electrical connector is positioned exactly on a PCB.

The electrical connector of the present invention is fixed on the PCB by a surface welding method. The electrical connector includes a connector body and an accessing device that is installed on the connector body. The connector body includes an insulation body that receives a plurality of pins and has a multilateral through hole in the middle of the connector body. The PCB has a positioning frame line that corresponds to the through hole. The characteristics of the connector are: the accessing device has one or a plurality of holes near the middle of the accessing device; the one or the plurality of holes cover at least one part of the positioning frame's two sides that are not located opposite.

The electrical connector of the present invention observes the positioning frame line via the holes that are located on the accessing device, and judges whether the electrical connector is positioned well with the PCB or not by checking whether the through hole of the insulation body is aligned to the positioning frame line or not. Therefore, the precision of the positioning is enhanced substantially and the welding effect is ensured between the electrical connector and the PCB.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
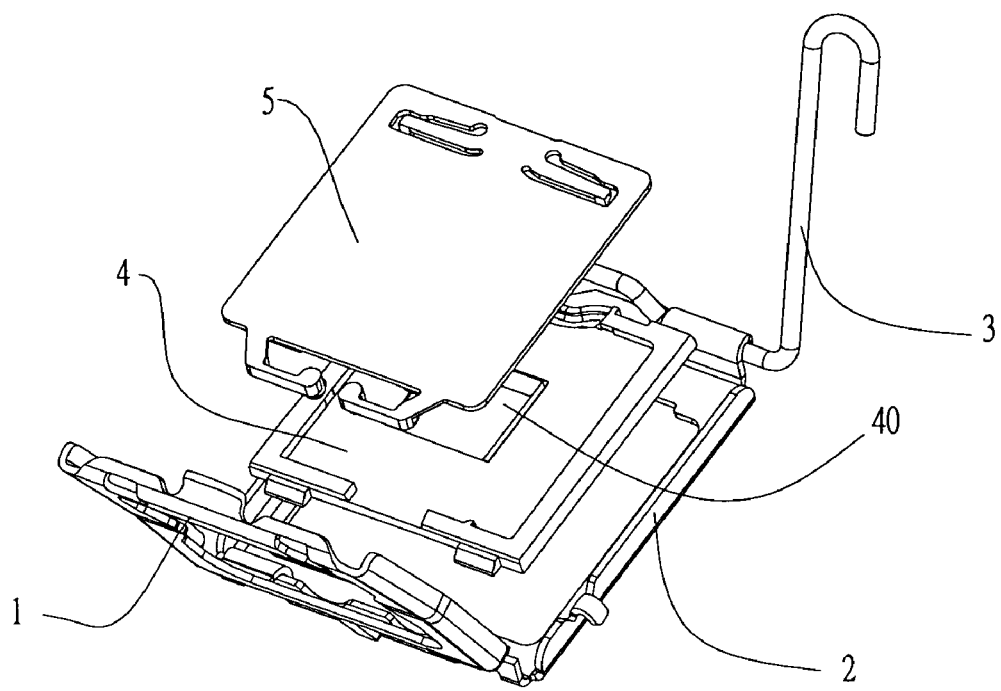
FIG. 1 is an exploded perspective view of the electrical connector of the prior art.
Figure 2:
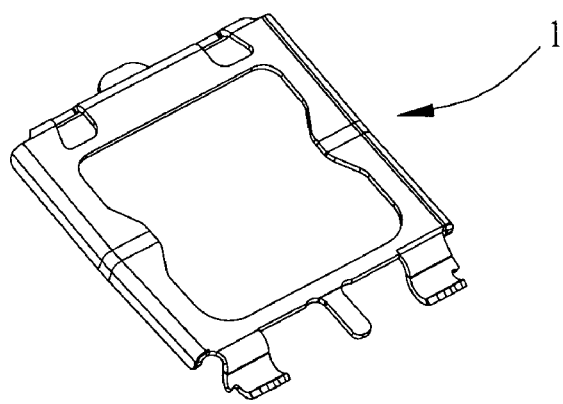
FIG. 2 is a perspective view of the upper metal shell of the electrical connector shown in FIG. 1.
Figure 3:
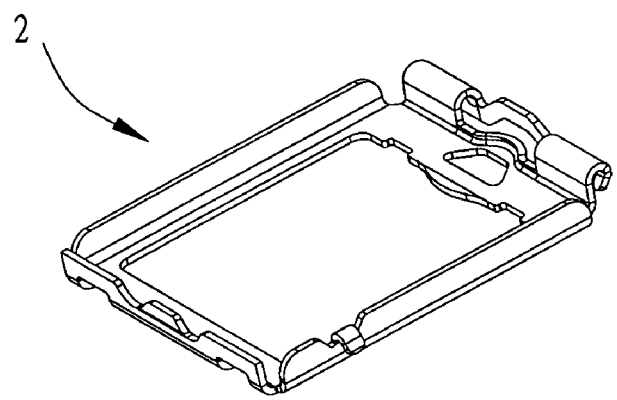
FIG. 3 is a perspective view of the lower metal shell of the electrical connector shown in FIG. 1.
Figure 4:
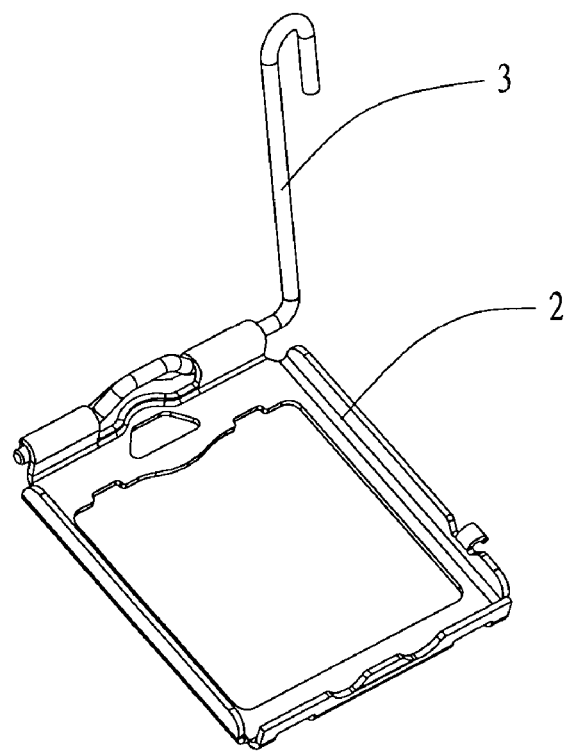
FIG. 4 is a perspective view of the lower metal shell and the pole of the electrical connector shown in FIG. 1.
Figure 5:
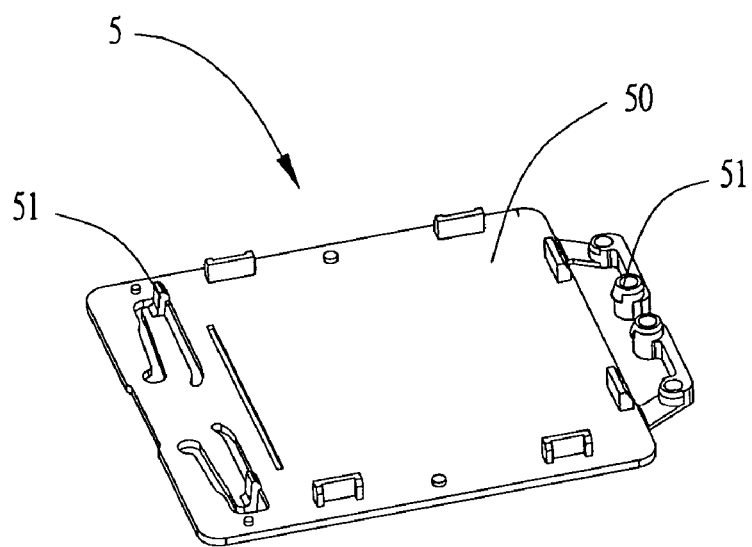
FIG. 5 is a perspective view of the accessing device of the electrical connector shown in FIG. 1.
Figure 6:
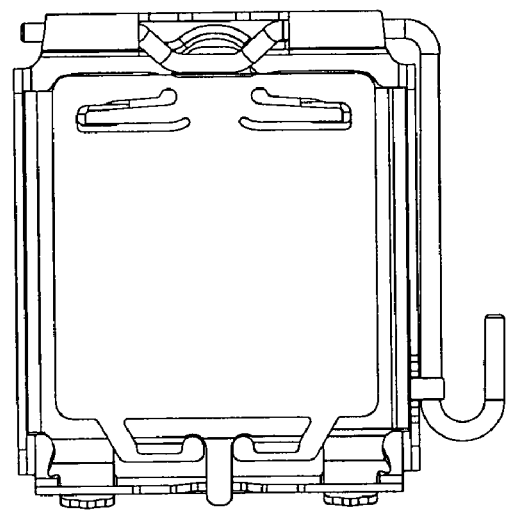
FIG. 6 is a top plan view of the electrical connector shown in FIG. 1 when assembled.
Figure 7:
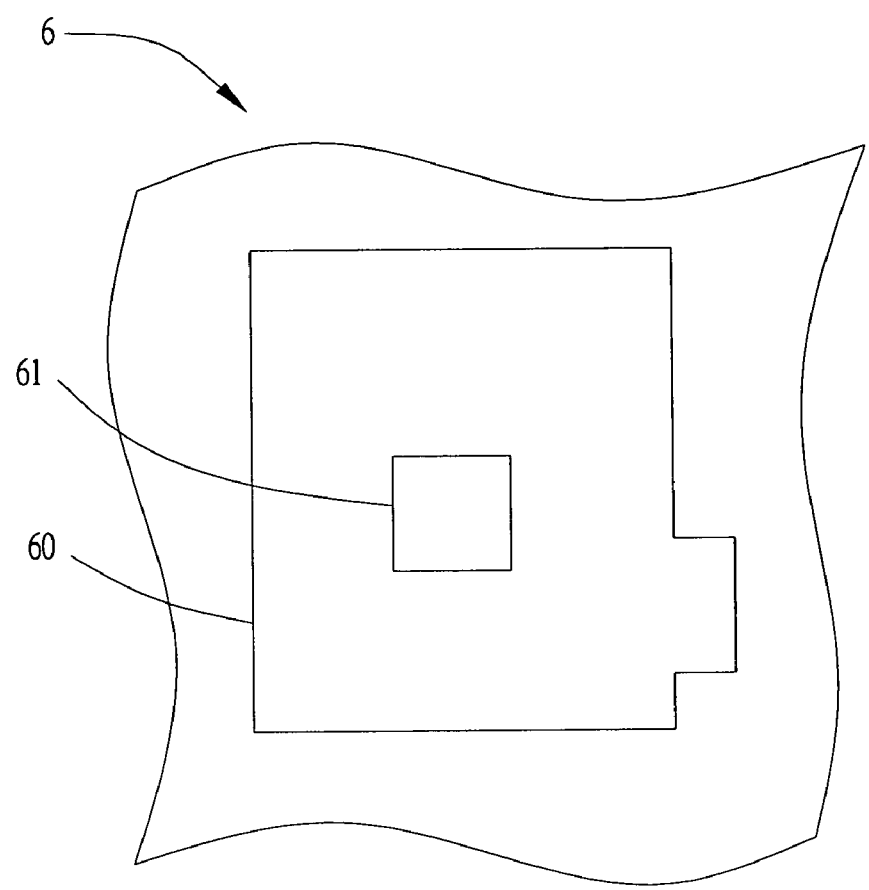
FIG. 7 is a top plan view of the PCB of the present invention.
Figure 8:
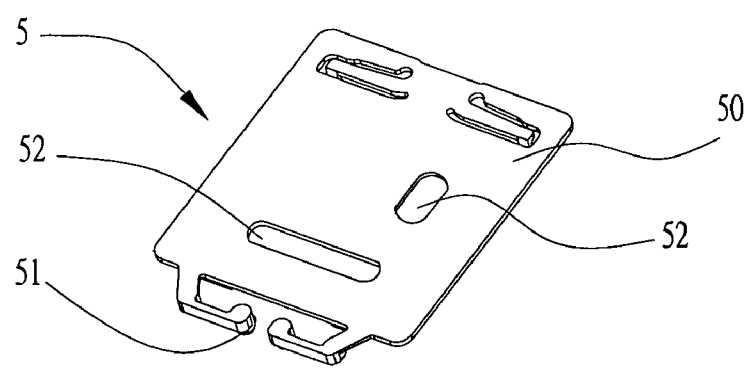
FIG. 8 is a perspective view of the accessing device of the electrical connector of the present invention.
Figure 9:
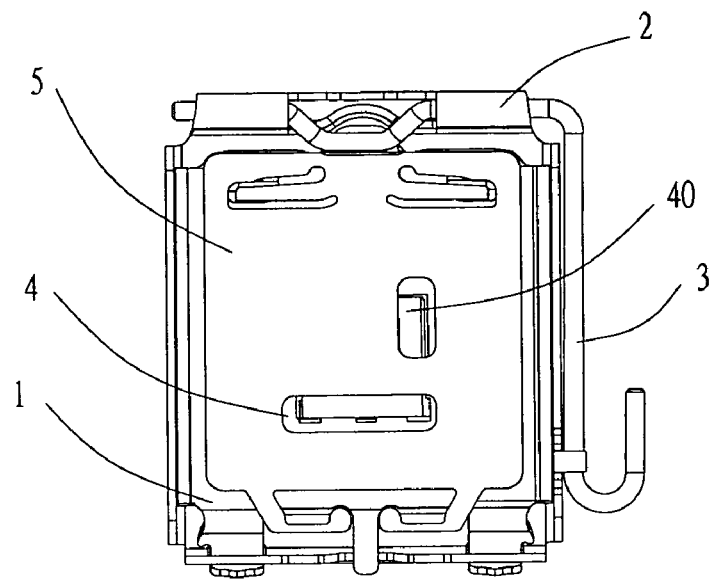
FIG. 9 is a top plan view of the electrical connector of the present invention is assembled.
Figure 10:
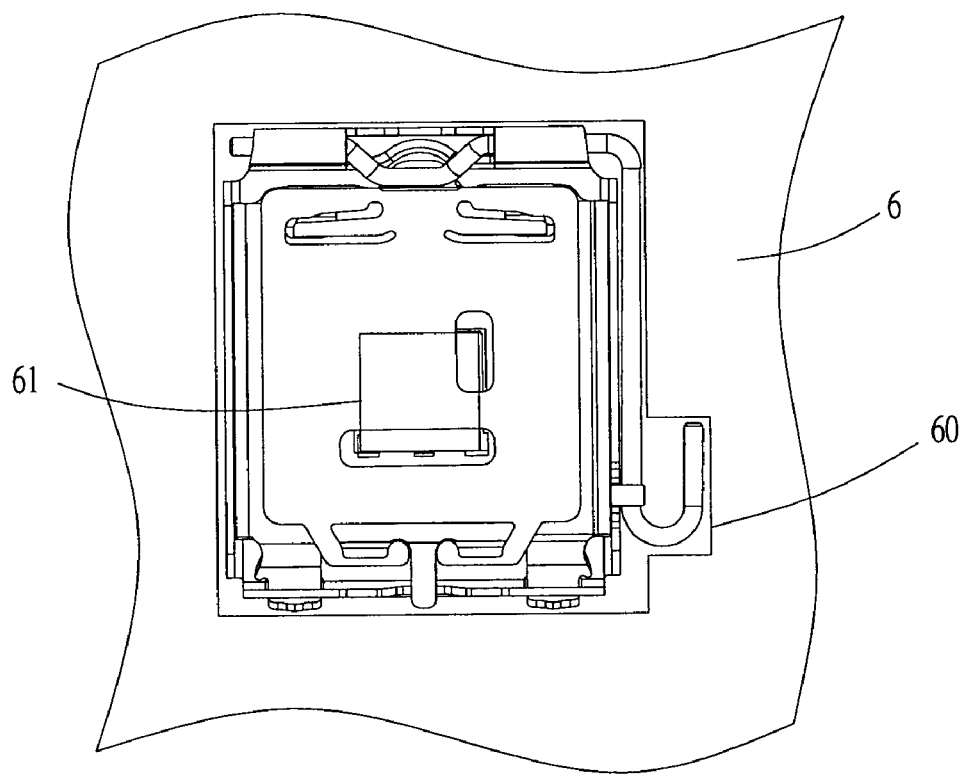
FIG. 10 is a top plan view of the electrical connector shown in FIG. 1 when located on the PCB.

Please refer to FIGS. 8~10. The electrical connector of the present invention is fixed on the PCB 6 by a surface welding method. The electrical connector includes a connector body and an accessing device. The connector body includes an upper metal shell 1 and a lower metal shell 2 that are connected to each other, a pole 3 that is used for buckling the upper metal shell 1 and the lower metal shell 2, and an insulation body 4 that is received in the lower metal shell 2. The insulation body 4 receives a plurality of pins (not shown in the figure) and has a square through hole 40 (or a multilateral through hole) in the middle of the insulation body 4. The accessing device 5 includes a board body 50 and a holding pin 51 that is downwardly extended from a lower surface of the board body 50. The holding pin 51 is used for fixing the accessing device 5 on the upper metal shell 1.

The PCB 6 has an outer positioning frame line 60 and an inner position frame line 61 that correspond to the outer fringe and the square through hole 40 of the electrical connector.

The accessing device 50 has one or a plurality of holes 52 near the middle of the accessing device 50. In this embodiment, the accessing device 50 has two holes that are vertical to each other. The one or the plurality of holes 52 cover at least one part (can also be the whole side) of two sides of the positioning frame 61 that are not located opposite. In this embodiment, the two sides are adjacent to each other. Therefore, it observes the location of two sides of the positioning frame 61 that are not located opposite. When the electrical connector is located on the PCB, whether or not the electrical connector is positioned well with the PCB is judged by checking whether the fringe of the through hole is aligned to the inner positioning frame line or not via the holes. Therefore, the precision of the positioning is enhanced substantially and the welding effect is ensured between the electrical connector and the PCB.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An electrical connector, fixed on a PCB by a surface welding method, the electrical connector comprises a connector body and an accessing device that is installed on the connector body, the connector body comprises an insulation body that receives a plurality of pins and has a multilateral through hole in the middle of the connector body, the PCB has a positioning frame line that corresponds to the through hole;

wherein the accessing device has at least one hole formed off-center therein revealing therethrough at least one part of two sides of the positioning frame line that are not located opposite one another.

2. The electrical connector as claimed in claim 1, wherein the connector body further comprises an upper metal shell and a lower metal shell that are connected to each other, a pole that is used for buckling the upper metal shell and the lower metal shell, and the insulation body is received in the lower metal shell.

3. The electrical connector as claimed in claim 1, wherein the PCB includes an outer positioning frame corresponding to an outline of the electrical connector.

4. An The electrical connector fixed on a PCB by a surface welding method, the electrical connector comprises a connector body and an accessing device that is installed on the connector body, the connector body comprises an insulation body that receives a plurality of pins and has a multilateral through hole in the middle of the connector body the PCB has a positioning frame line that corresponds to the through hole;

wherein the shape of the positioning frame line is square, the accessing device has two holes that are vertically displaced with respect to each other and the adjacent sides of the positioning frame line are observed via each hole.

* * * * *